(12) United States Patent
Chang et al.

(10) Patent No.: US 8,469,467 B2
(45) Date of Patent: Jun. 25, 2013

(54) RAIL DEVICE AND SERVER

(75) Inventors: Lin-Wei Chang, Taipei (TW);
Yung-Chin Hsu, Taipei (TW);
Chi-Chun Yang, Taipei (TW)

(73) Assignee: Inventec Corporation, Taipei (TW)

( * ) Notice: Subject to any disclaimer, the term of this patent is extended or adjusted under 35 U.S.C. 154(b) by 455 days.

(21) Appl. No.: 12/728,431

(22) Filed: Mar. 22, 2010

(65) Prior Publication Data

US 2011/0100936 A1 May 5, 2011

(30) Foreign Application Priority Data

Nov. 4, 2009 (TW) .............................. 98137472 A (51) Int. Cl.
*A47B 95/00* (2006.01)
(52) U.S. Cl.
USPC .......................... 312/333; 211/26; 312/334.8
(58) Field of Classification Search
USPC ........... 211/26, 126.15, 151, 162; 312/334.8, 312/334.44, 334.46, 334.7, 334.1, 334.4, 312/334.27, 334.5, 334.16, 334.32, 334.6, 312/333; 384/21
See application file for complete search history.

(56) References Cited

U.S. PATENT DOCUMENTS

| | | | | |
|---|---|---|---|---|
| 2,295,697 A * | 9/1942 | Sulentic | ..................... | 312/334.8 |
| 4,440,461 A * | 4/1984 | Powell et al. | .............. | 312/334.8 |
| 4,872,734 A * | 10/1989 | Rechberg | ....................... | 312/333 |
| 5,492,400 A * | 2/1996 | Rock | .............................. | 312/331 |
| 5,564,807 A * | 10/1996 | Rock et al. | .................... | 312/331 |
| 5,626,406 A * | 5/1997 | Schmid | .................... | 312/334.28 |
| 6,036,288 A * | 3/2000 | Shih | .......................... | 312/223.3 |
| 6,988,626 B2 * | 1/2006 | Varghese et al. | ................ | 211/26 |
| 7,744,176 B2 * | 6/2010 | Milligan | .................. | 312/334.32 |
| 7,780,254 B2 * | 8/2010 | Wang et al. | ................. | 312/334.7 |
| 2002/0158556 A1* | 10/2002 | Cheng | .......................... | 312/333 |
| 2003/0209958 A1* | 11/2003 | Hwang et al. | ............ | 312/334.46 |
| 2008/0143226 A1* | 6/2008 | Huang et al. | ............... | 312/334.8 |
| 2008/0157643 A1* | 7/2008 | Chen | .......................... | 312/334.6 |
| 2010/0033926 A1* | 2/2010 | Du et al. | .................. | 361/679.58 |
| 2010/0089853 A1* | 4/2010 | Wang et al. | .................. | 211/183 |
| 2010/0264792 A1* | 10/2010 | Chang | .......................... | 312/294 |
| 2011/0100935 A1* | 5/2011 | Yang | .............................. | 211/26 |
| 2011/0100936 A1* | 5/2011 | Chang et al. | ..................... | 211/26 |

* cited by examiner

Primary Examiner — Darnell Jayne
Assistant Examiner — Patrick Hawn
(74) Attorney, Agent, or Firm — J.C. Patents (57) ABSTRACT

A rail device and a server are provided. The server includes a rack, at least one chassis, and a rail device. The rail device includes a first rail and a bracket. The first rail is installed in the chassis. The bracket includes a second rail and a supporter, and the second rail is mounted onto the rack. The supporter has a first end and a second end. The first end is coupled to the second rail, and the second end is slidably disposed at the first rail, so that the chassis moves between a first position and a second position relative to the rack. When the chassis is located at the second position, the first end leans against the second rail, and the second end leans against the first rail, so that the supporter supports the chassis on the rack.

7 Claims, 13 Drawing Sheets

RAIL DEVICE AND SERVER

CROSS-REFERENCE TO RELATED APPLICATION

This application claims the priority benefit of Taiwan application serial no. 98137472, filed on Nov. 4, 2009. The entirety of the above-mentioned patent application is hereby incorporated by reference herein and made a part of this specification.

BACKGROUND OF THE INVENTION

1. Field of the Invention

The invention relates to a rail device. More particularly, the invention relates to a rail device applicable to a server.

2. Description of Related Art

Currently, an industrial server allows a user to control the operation of peripheral equipment or machines. In the server, a chassis having two side walls is utilized, a bottom of the chassis is connected between the two side walls, and an accommodation space capable of accommodating hardware equipment including a power source, various circuit boards, and a disk array is formed between the two side walls. After the hardware equipment including the power source, the circuit boards, and the disk array is installed in the chassis, the chassis must be placed into a chassis cabinet for the user to control the operation of the peripheral equipment.

The aforesaid chassis is disposed on a fixed-type L-shaped rack in the chassis cabinet. Given that the hardware equipment within the chassis is damaged or needs to be expanded, the chassis must be disassembled from the L-shaped rack, and the hardware equipment in the chassis can then be repaired or expanded. After the repair or expansion is done, the chassis must be assembled back to the L-shaped rack in the chassis cabinet, which creates inconvenience to maintenance and expansion of the hardware equipment.

Accordingly, some manufacturers modify the L-shaped rack to make retractable rails. When the hardware equipment in the chassis is damaged or needs to be expanded, the chassis can be directly pulled out from the chassis cabinet, and the hardware equipment in the chassis can then be repaired or expanded. After the repair or expansion of the hardware equipment in the chassis is done, the chassis is pushed back to the chassis cabinet, and the maintenance or expansion of the hardware equipment is completed.

Although the aforesaid rails facilitate the maintenance or expansion of the hardware equipment in the chassis, said rails occupy internal space of the chassis cabinet, i.e. internal space in the chassis cabinet is reduced, such that installation of the hardware equipment in the chassis cannot go smoothly, or that expandability of the server is adversely affected because less hardware equipment can be installed in the chassis.

SUMMARY OF THE INVENTION

The invention is directed to a rail device having a chassis with relatively large accommodation space.

The invention is further directed to a server having a movable chassis with relatively large accommodation space.

In an embodiment of the invention, a rail device adapted to a server is provided. The server includes a rack and at least one chassis. The rail device includes a first rail and a bracket. The first rail is installed in the chassis. The bracket includes a second rail and a supporter, and the second rail is mounted onto the rack. The supporter has a first end and a second end. The first end is coupled to the second rail, and the second end is slidably disposed at the first rail, such that the chassis moves between a first position and a second position relative to the rack. When the chassis is located at the second position, the first end of the supporter leans against the second rail, and the second end of the supporter leans against the first rail, such that the supporter supports the chassis on the rack.

In an embodiment of the invention, a server including a rack, at least one chassis, and a rail device is provided. The rail device includes a first rail and a bracket. The first rail is installed in the chassis. The bracket includes a second rail and a supporter, and the second rail is mounted onto the rack. The supporter has a first end and a second end. The first end is coupled to the second rail, and the second end is slidably disposed at the first rail, such that the chassis moves between a first position and a second position relative to the rack. When the chassis is located at the second position, the first end of the supporter leans against the second rail, and the second end of the supporter leans against the first rail, such that the supporter supports the chassis on the rack.

According to an embodiment of the invention, the bracket further includes a slide block slidably coupled to the second rail, and a first end of the supporter is mounted onto the slide block.

According to an embodiment of the invention, the rail device further includes a first latch disposed between the chassis and the supporter. When the chassis moves away from the first position, the first latch locks the chassis and the supporter, such that the chassis moves the slide block along the second rail.

According to an embodiment of the invention, the second rail has a first stopper. When the chassis moves to the second position, the first stopper blocks movement of the slide block.

According to an embodiment of the invention, the rail device further includes a driver and a second latch. The driver is slidably disposed at the second rail and slidably coupled to the supporter. The second latch is disposed at the second rail and located on a moving path of the slide block and the driver. The second latch has a second stopper and a pressing portion. When the chassis moves from the second position to the first position, the second stopper blocks movement of the slide block, the chassis pushes the driver to press the pressing portion, such that the second stopper is driven to stop blocking the slide block.

According to an embodiment of the invention, the bracket further includes a driver coupled to the supporter. When the chassis moves away from the first position, the first latch locks the driver, and the driver drives the supporter and the slide block to move along the second rail.

According to an embodiment of the invention, the second rail has an actuator. When the chassis is located between the first position and the second position, the actuator drives the first latch to release the driver.

According to an embodiment of the invention, the second rail further has a first stopper and a second stopper. When the actuator drives the first latch to release the driver, the first stopper blocks movement of the driver, the second stopper blocks the movement of the slide block, and the chassis moves to the second position relative to the supporter.

According to an embodiment of the invention, when the chassis is located at the second position, the driver leans against the second rail and supports the supporter.

According to an embodiment of the invention, the rail device further includes a second latch disposed on the chassis. When the chassis moves to the second position, the second latch locks the supporter to fix the chassis onto the bracket.

Based on the above, the rail is installed at the inner side of the chassis according to the above embodiments of the invention, so as to effectively increase the accommodation space of the chassis. Moreover, by the arrangement of the chassis, the bracket, and the rails, the chassis can be pulled out or pushed in relative to the rack. Besides, when the chassis is pulled out from the rack, the supporter of the bracket can support the chassis on the rack. Therefore, the server of the invention includes movability and expansibility as its special features.

It is to be understood that both the foregoing general descriptions and the following detailed embodiments are exemplary and are, together with the accompanying drawings, intended to provide further explanation of technical features and advantages of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In the invention, a first rail of a rail device is installed at the inner side of a chassis, so as to effectively increase the accommodation space of the chassis. Moreover, by the arrangement of rails, a bracket, and the chassis, the chassis of a server can be supported by the bracket after the chassis is moved out from the rack. Two embodiments are provided below to elaborate the invention, while the server and the rail device of the invention are not limited to those described in the following two embodiments.

[First Embodiment]

Figure 1:
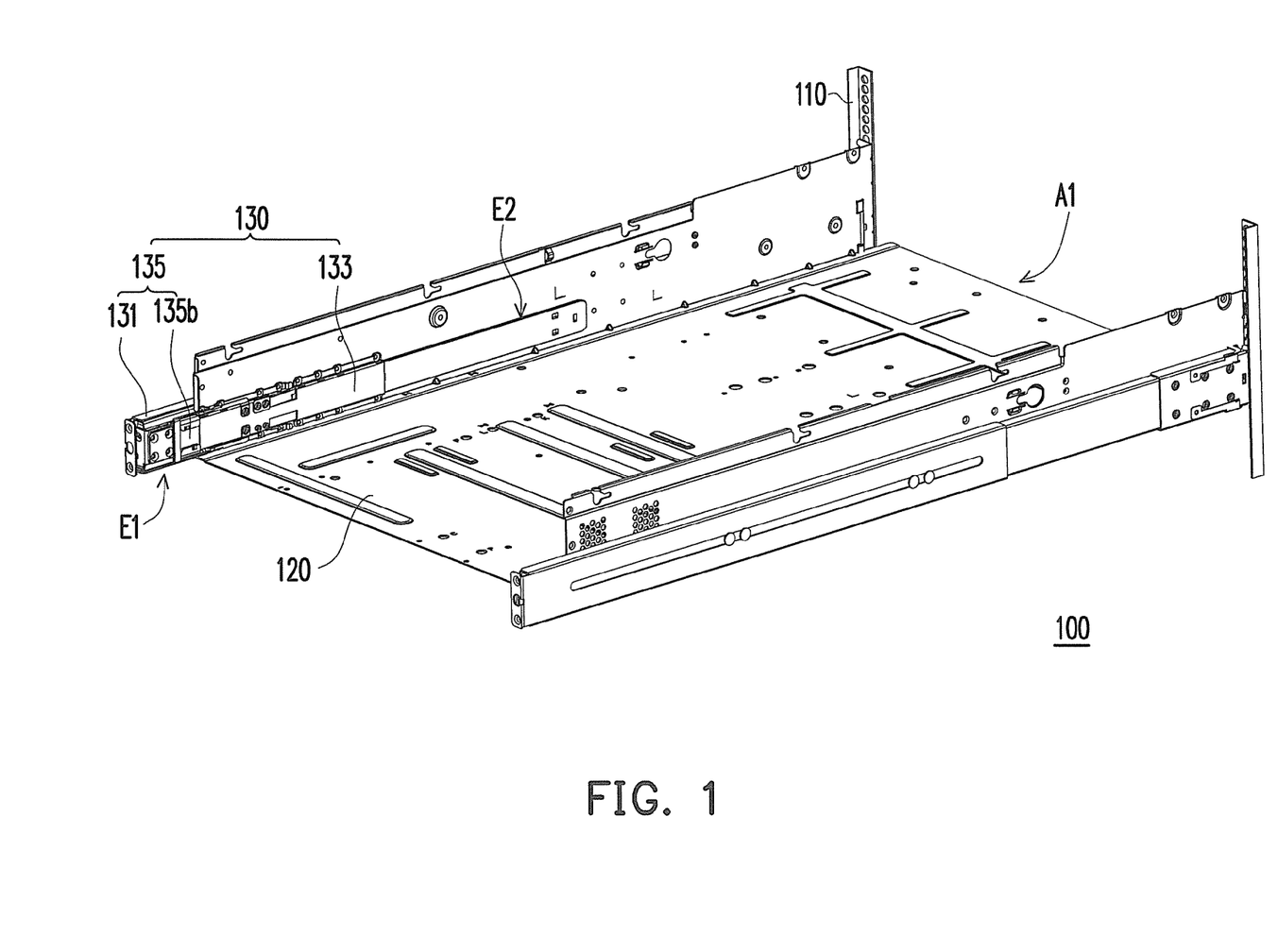
FIGS. 1 and 2 are schematic views illustrating a server according to an embodiment of the invention.
Figure 2:
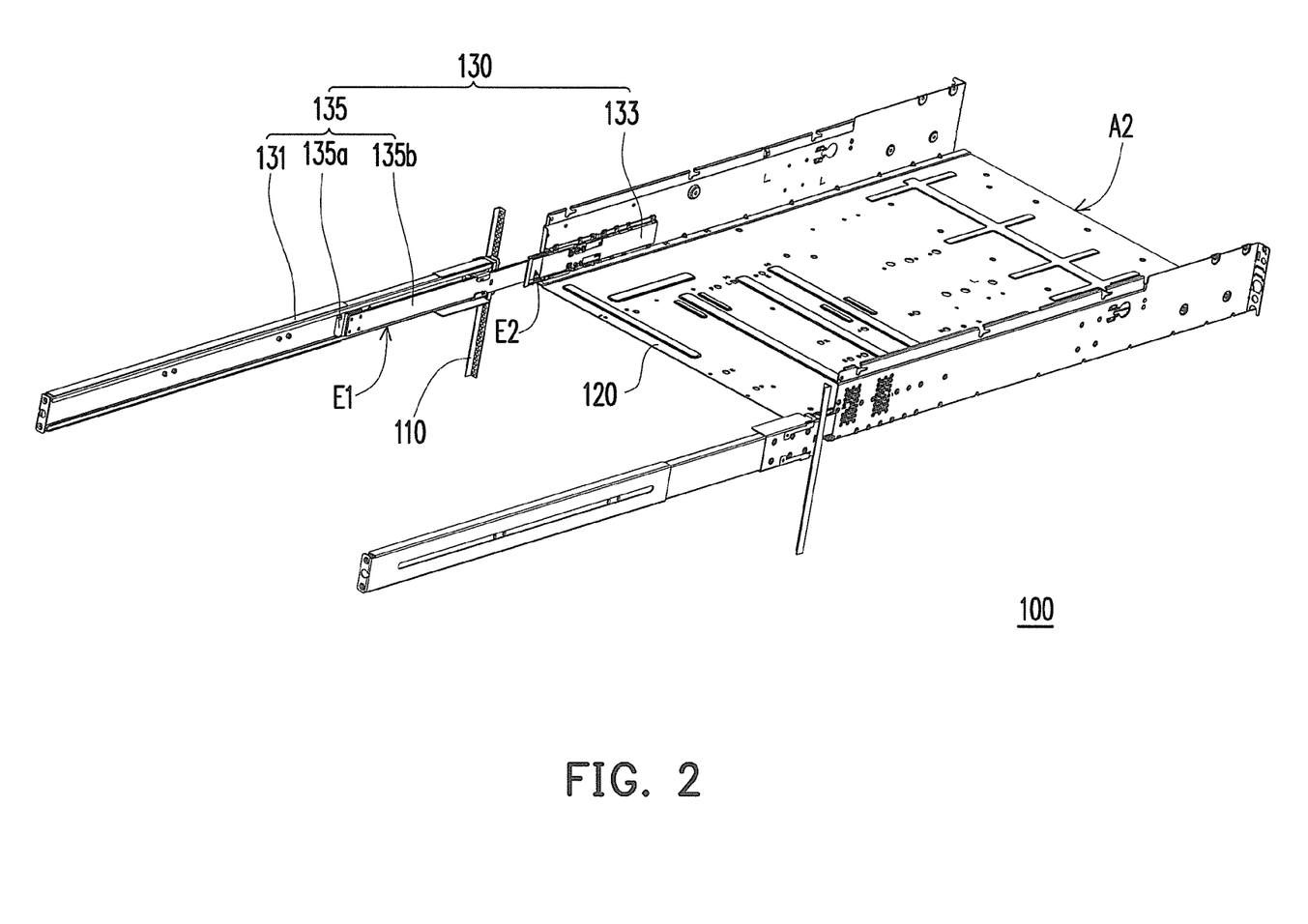

FIGS. 1 and 2 are schematic views illustrating a server according to an embodiment of the invention. FIG. 1 shows that a chassis of a server is located at a first position, while FIG. 2 shows that the chassis of the server is located at the second position. With reference to FIGS. 1 and 2 together, the server 100 includes a rack 110, at least one chassis 120, and a rail device 130. The rail device 130 is disposed on the rack 110 and the chassis 120 to move the chassis 120 between a first position A1 in FIG. 1 and a second position A2 in FIG. 2 relative to the rack 110.

Figure 3:
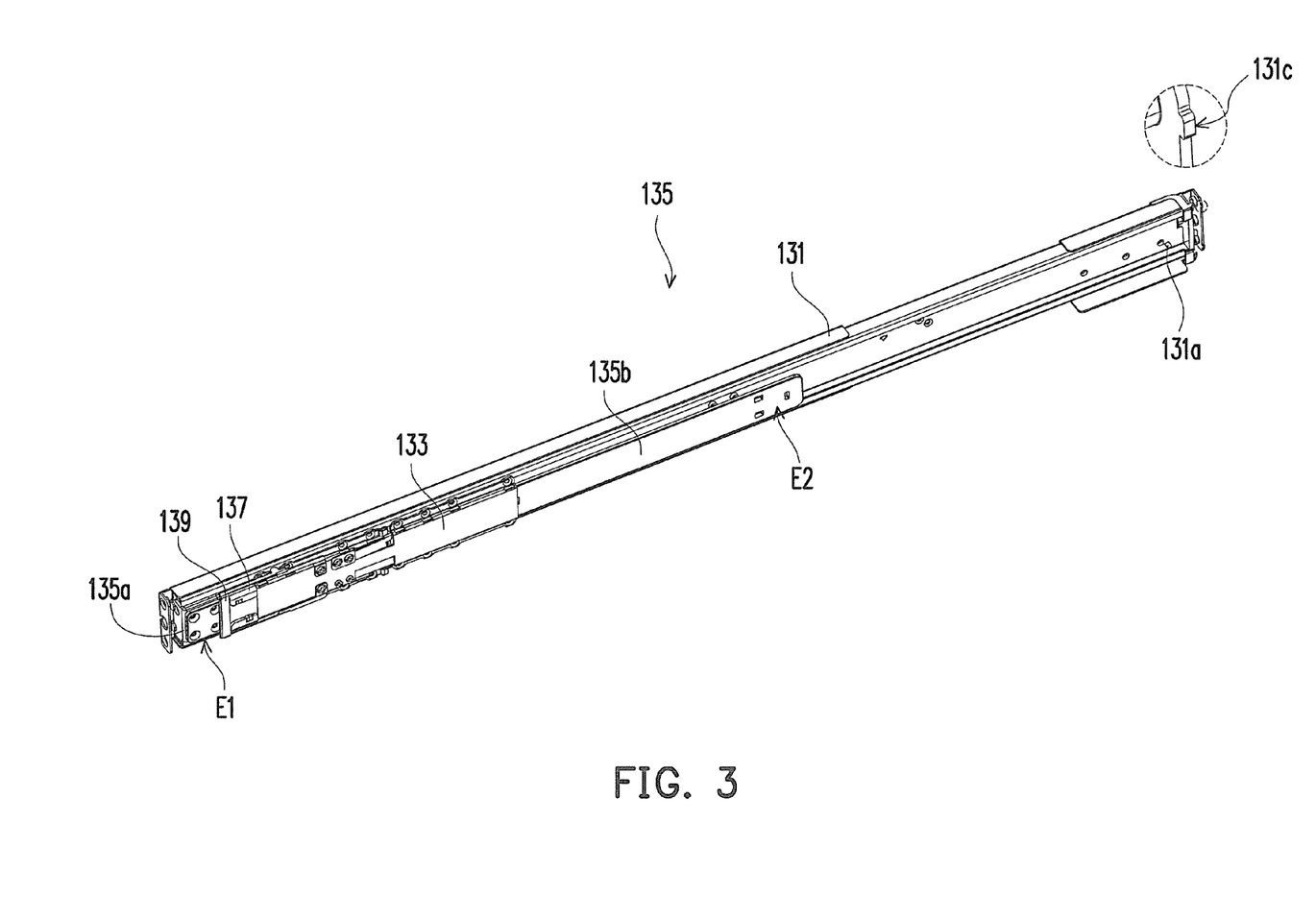
FIG. 3 is a schematic view illustrating partial components in the server depicted in FIG. 1.

In the server, even though the rail devices 130 are disposed in pairs at respective sides of the chassis 120, only the rail device 130 at one side is described. FIG. 3 is a schematic view illustrating partial components in the server depicted in FIG. 1. Here, the chassis 120 is omitted, so as to clearly show components that correlate with the rail device 130. With reference to FIGS. 1 to 3, in this embodiment, the rail device 130 includes a first rail 133 and a bracket 135, and the first rail 133 is installed in the chassis 120. The bracket 135 includes a second rail 131 and a supporter 135*b*, and the second rail 131 is mounted onto the rack 110.

The bracket 135*b* has a first end E1 and a second end E2. The first end E1 is coupled to the second rail 131, while the second end E2 is slidably disposed at the first rail 133. When the chassis 120 is located at the second position A2, the first end E1 of the supporter 135*b* leans against the second rail 131, and the second end E2 leans against the first rail 133, such that the bracket 135 supports the chassis 120 on the rack 110. In this embodiment, the first rail 133 and the chassis 120 are integrally formed. That is to say, during fabrication of the chassis 120, a plate can be bent and riveted to form the first rail 133 in the chassis 120, so as to simplify fabrication and reduce costs.

Figure 4:
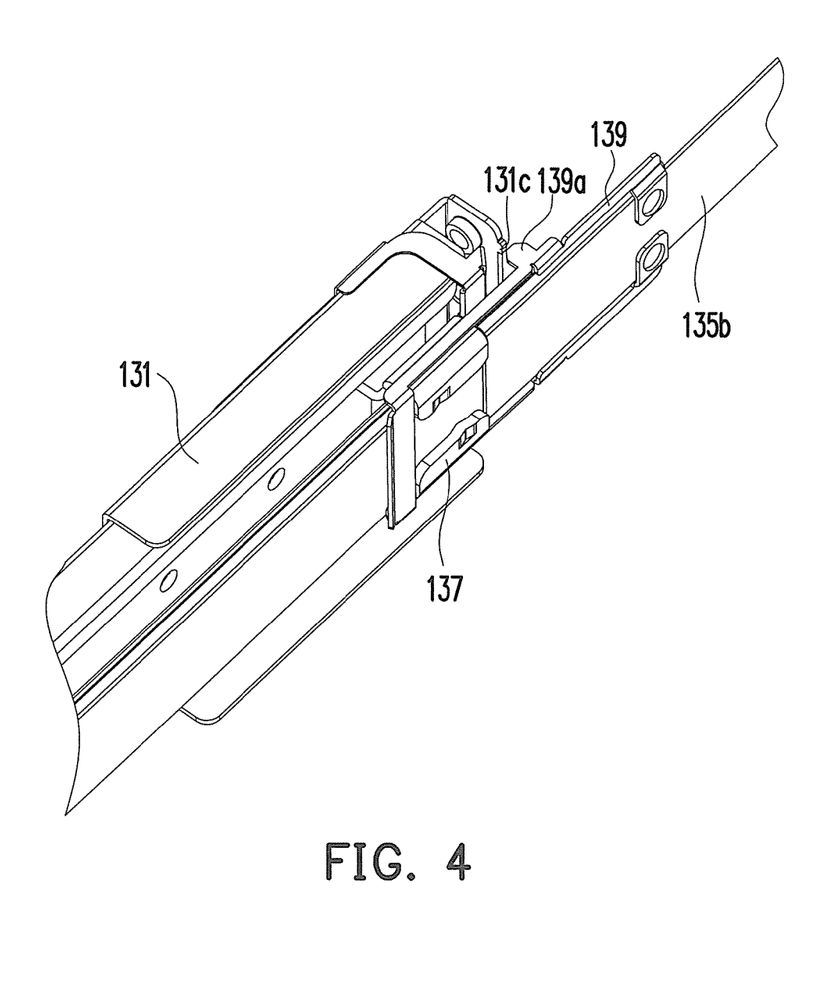
FIGS. 4 and 5 are schematic views sequentially illustrating movement of the chassis of FIG. 1 away from a first position.
Figure 5:
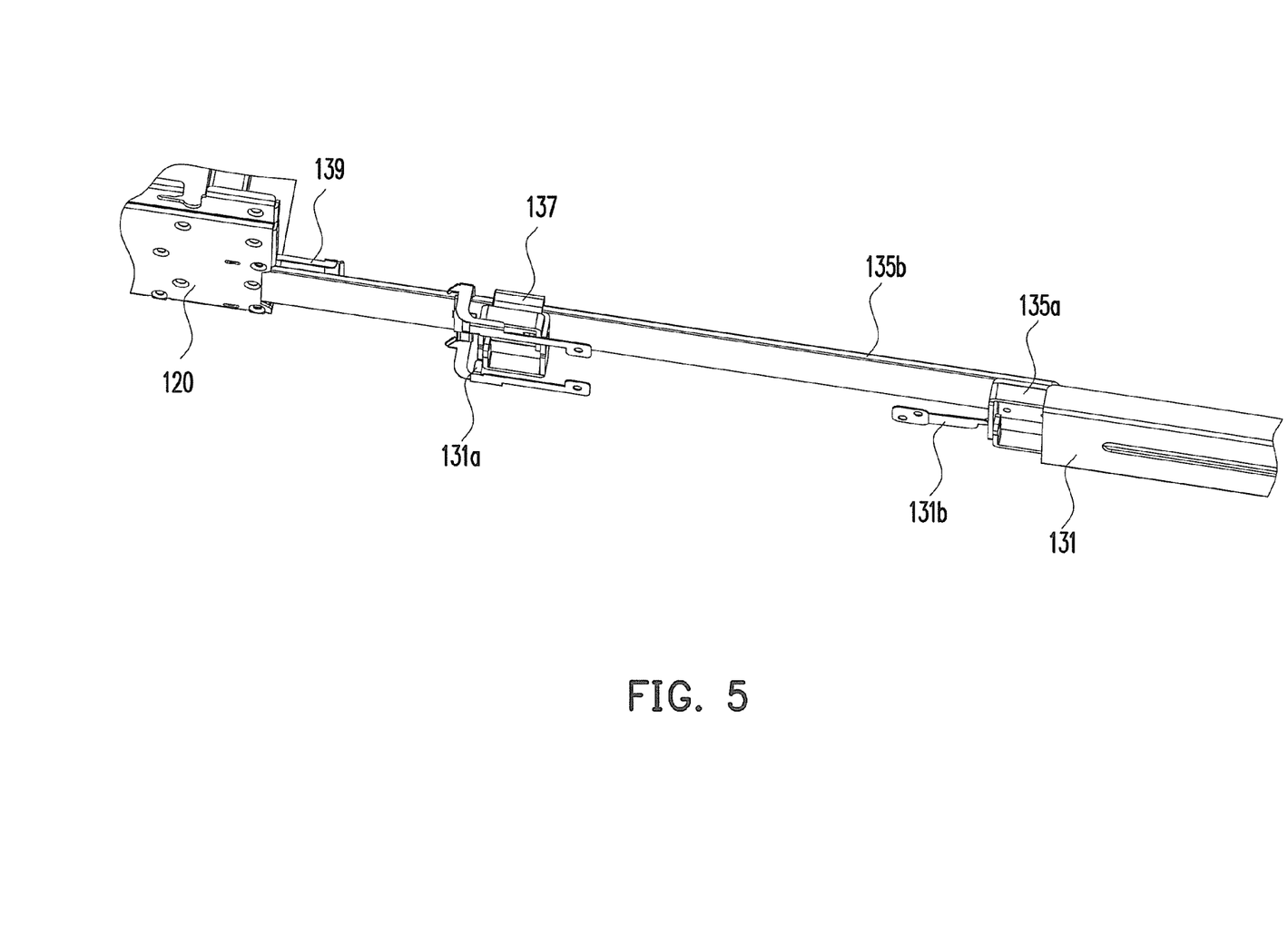
Figure 6:
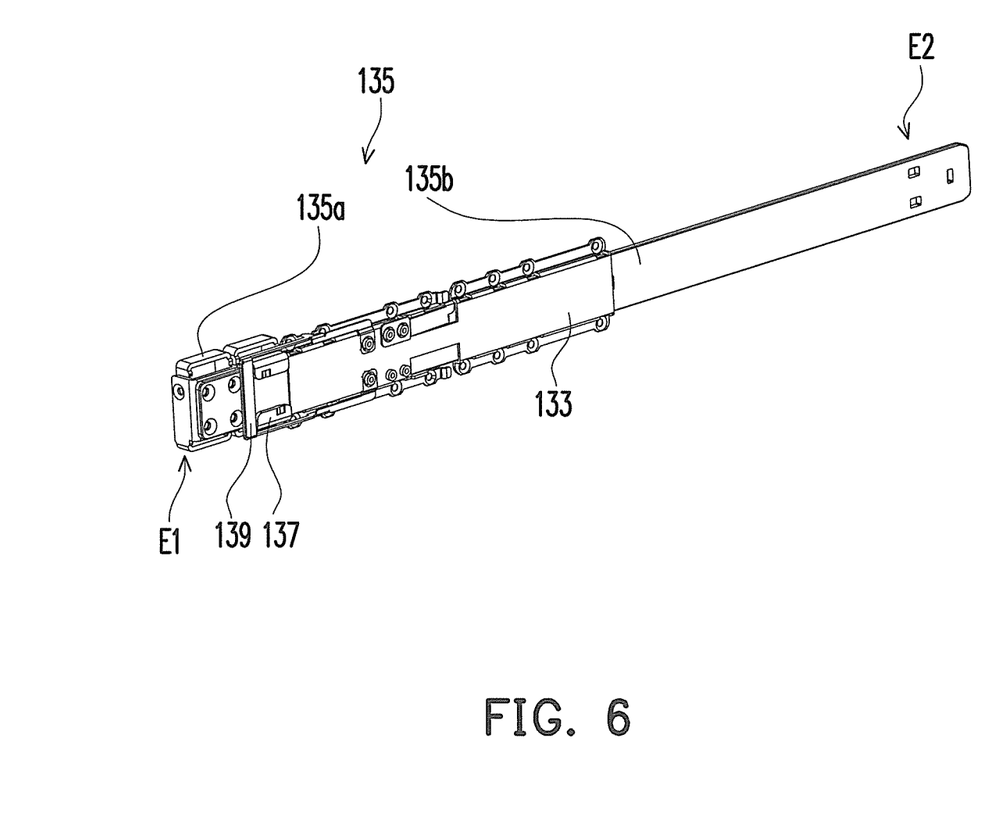
FIG. 6 is a schematic view illustrating the bracket depicted in FIG. 3.

FIGS. 4 and 5 are schematic views sequentially illustrating movement of the chassis of FIG. 1 away from the first position. FIG. 6 is a schematic view illustrating the bracket depicted in FIG. 3. As indicated in FIGS. 3 to 6, according to this embodiment, the bracket 135 further includes a slide block 135*a*, and the first end E1 of the supporter 135*b* is mounted onto the slide block 135*a*. Note that the rail device 130 of this embodiment further includes a first latch 139 disposed between the chassis 120 and the supporter 135*b*. When the chassis 120 moves away from the first position A1 (depicted in FIG. 1), the first latch 139 locks the chassis 120 and the supporter 135*b*, such that the chassis 120 drives the slide block 135*a* to move along the second rail 131. To be more specific, the driver 137 interferes with the supporter 135*b*. Therefore, when the first latch 139 on the chassis 120 locks and moves the driver 137, the driver 137 drives the supporter 135*b* by friction, such that the slide block 135*a* is correspondingly moved as well. Here, the first latch 139 is made by a metal plate and locked at the first rail 133 in the chassis 120, which should not be construed as limited to this invention.

Please refer to FIGS. 2 to 5. The second rail 131 has a first stopper 131*a*, a second stopper 131*b*, and an actuator 131*c*. When the chassis 120 moves away from the first position A1 in FIG. 1, the actuator 131*c* at the second rail 131 pushes against a protrusion 139*a* of the first latch 139, and the first latch 139 releases the driver 137 because of metallic flexibility of the first latch 139. It should be mentioned that external configurations of the actuator 131*c* and the first latch 139 are not limited in this embodiment. Namely, this embodiment is applicable as long as the first latch 139 can unlatch the driver 137 after the chassis 120 moves away from the first position A1. In addition, where the actuator 131*c* interacts with the first latch 139 is not limited in this embodiment. Based on actual demand, a proper position between the first position A1 and the second position A2 of the chassis 120 can be determined to allow interaction between the actuator 131*c* and the first latch 139.

After the actuator 131*c* at the second rail 131 drives the first latch 139 to release the driver 137, the first stopper 131*a* and the second stopper 131*b* respectively block the driver 137 and the slide block 135*a*, such that the driver 137 and the slide block 135*a* stay at the second rail 131. At this time, the chassis 120 moves relative to the supporter 135b via the first rail 133 and then arrives at the second position A2.

On the other hand, when the chassis 120 arrives at the second position A2 and is completely pulled out from the rack 110, the driver 137 leans against the second rail 131 and supports the supporter 135b. Thereby, not only the bracket 135 leans against the second rail 131 via the first end E1 of the supporter 135b and against the first rail 133 via the second end E2 to support the chassis 120, but also the chassis 120 remains horizontal after the chassis 120 is pulled out from the rack 110.

Figure 7:
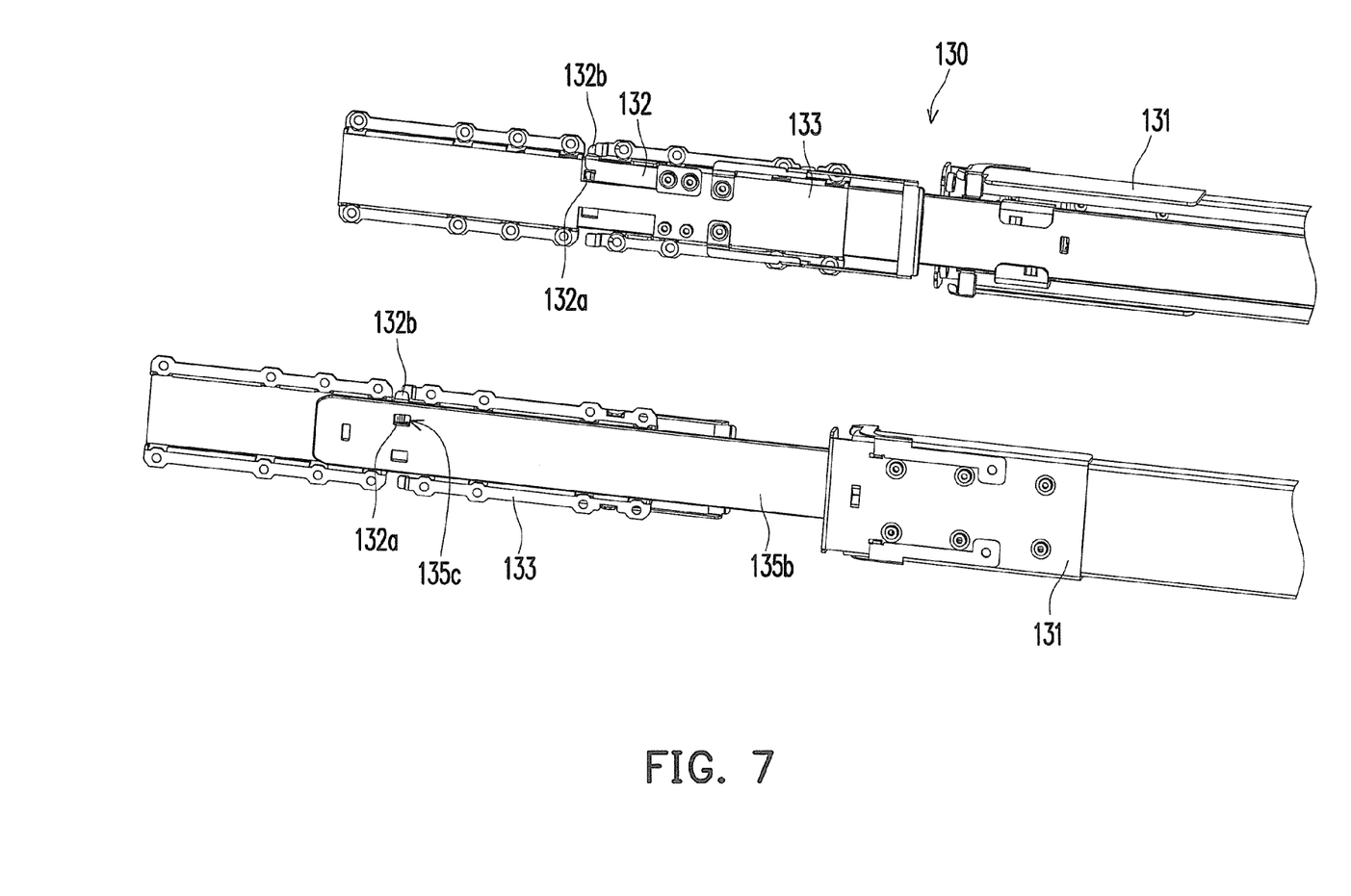
FIG. 7 is a schematic view illustrating partial components in the server depicted in FIG. 2 at another view angle.

FIG. 7 is a schematic view illustrating partial components in the server depicted in FIG. 2 at another view angle. The first rail and the chassis are omitted in FIG. 7 to clearly show the bracket and the second rail. With reference to FIGS. 2 and 7, the rail device 130 further includes a second latch 132 of which a side is mounted onto the chassis 120. The second latch 132 is, for example, a metal fastener having a pressing portion 132b and a buckling portion 132a. When the chassis 120 moves away from the first position A1 to the second position A2, the buckling portion 132a is fastened to an opening 135c on the supporter 135b. As such, the chassis 120 can be fixed onto the supporter 135b to prevent the chassis 120 from falling down from the rail device 130. When the chassis 120 is to be removed from the rail device 130, the pressing portion 132b of the second latch 132 is pressed and moved away from the opening 135c, such that the chassis 120 can be removed from the rail device 130.

Second Embodiment

Figure 8:
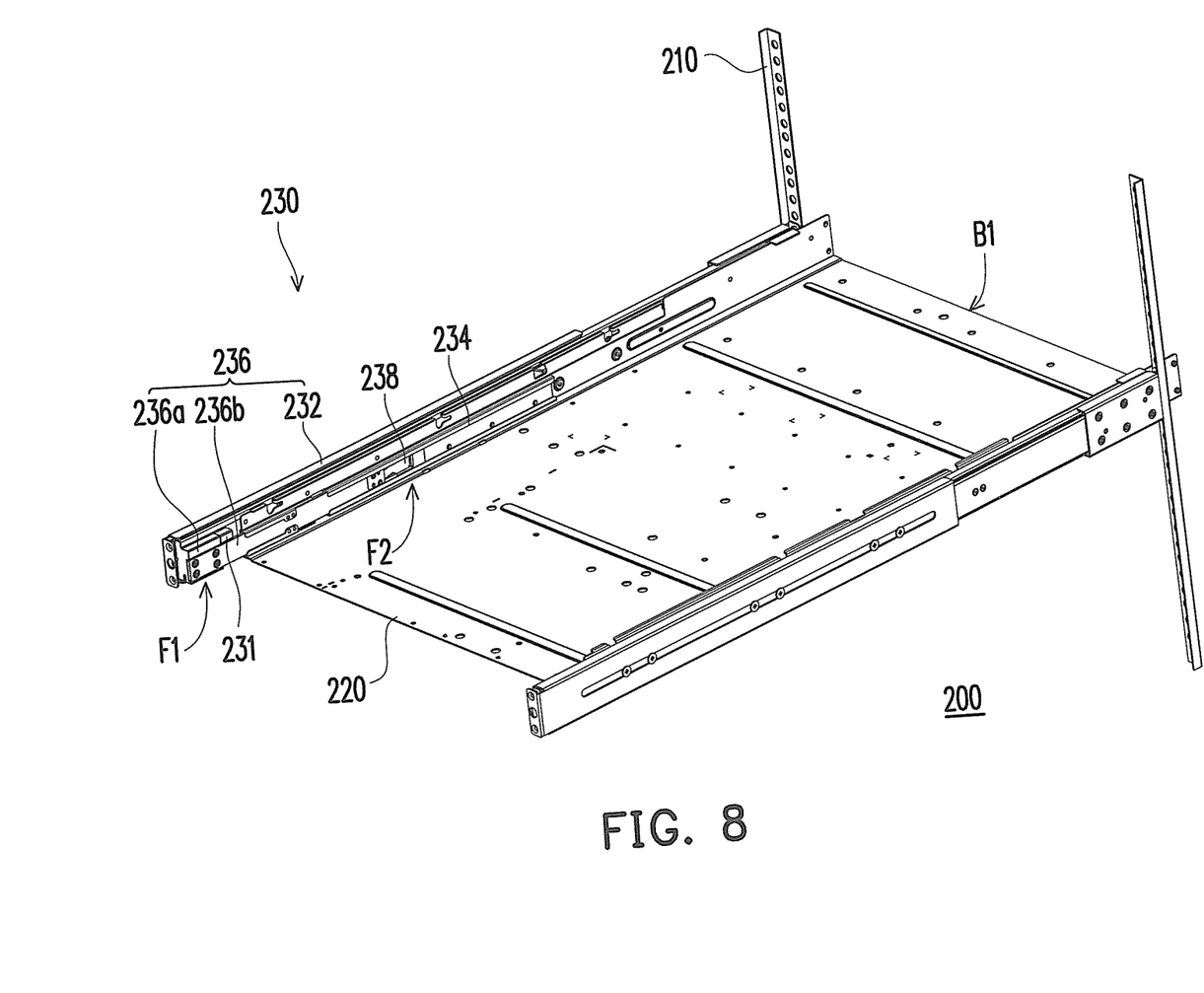
FIG. 8 is a schematic view illustrating a server according to an embodiment of the invention.
Figure 9:
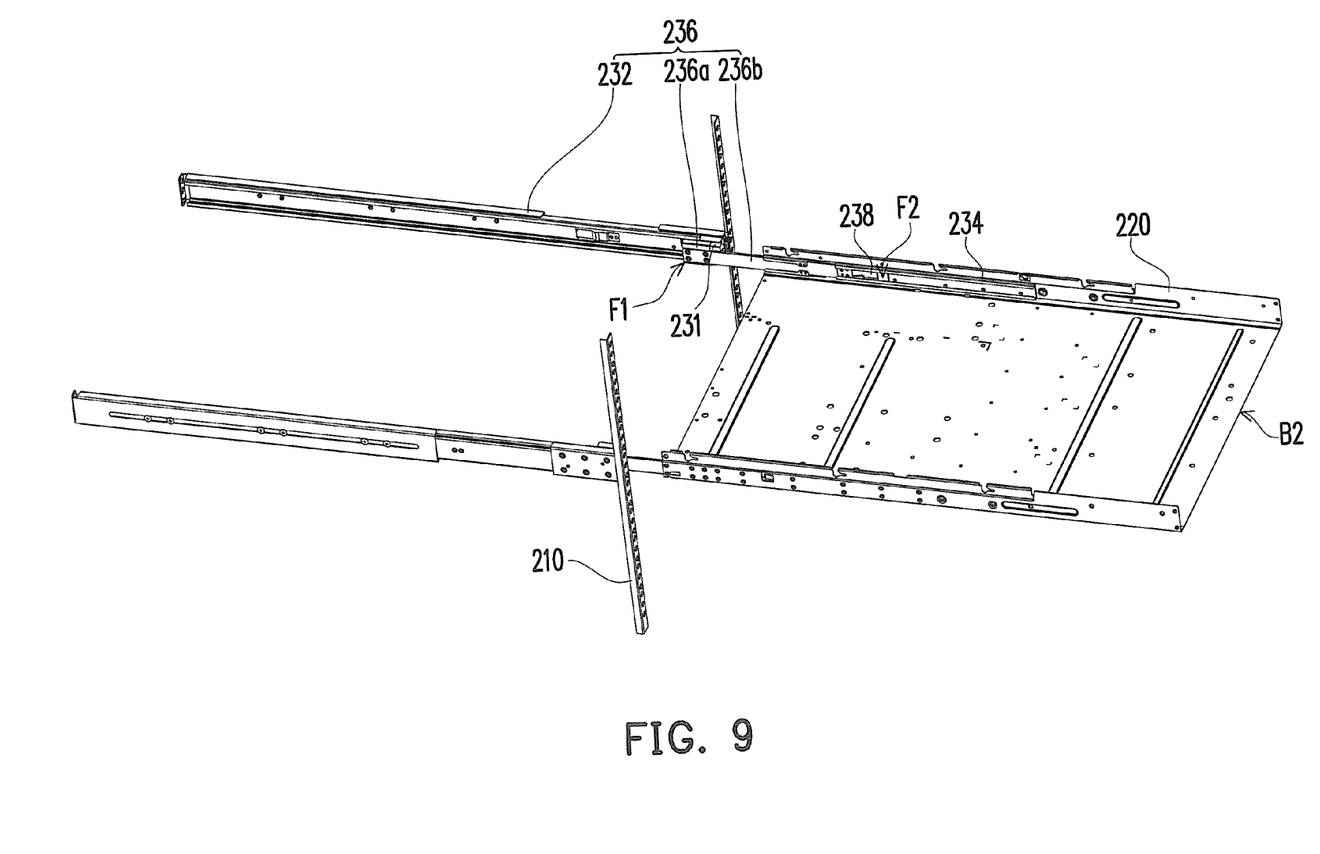
FIG. 9 is a schematic view illustrating the server depicted in FIG. 8 at another view angle.

FIG. 8 is a schematic view illustrating a server according to an embodiment of the invention. FIG. 9 is a schematic view illustrating the server depicted in FIG. 8 at another view angle. FIGS. 8 and 9 respectively illustrate the state of a chassis of the server at different locations. With reference to FIGS. 8 and 9, the server 200 of this embodiment includes a rack 210, a chassis 220, and a rail device 230. To better describe the invention, only one chassis 220 is taken for example, while the number of the chassis 220 in the server 200 is not limited in the invention. The rail device 230 is disposed on the rack 210 and the chassis 220 to move the chassis 220 between a first position B1 in FIG. 8 and a second position B2 in FIG. 9 relative to the rack 210.

Even though the rail devices 230 are disposed in pairs on the rack 210 and the chassis 220, only the rail device 230 at one side of the chassis 220 is described herein, and descriptions of the rail device 230 at the other side of the chassis 220 are omitted. In this embodiment, the rail device 230 includes a first rail 234 and a bracket 236. The first rail 234 is installed in the chassis 220. The bracket 236 includes a second rail 232 and a supporter 236b, and the second rail 232 is mounted onto the rack 210. The supporter 236b has a first end F1 and a second end F2. The first end F1 is coupled to the second rail 232, and the second end F2 is slidably disposed at the first rail 234, so that the chassis 220 moves between the first position B1 and the second position B2 relative to the rack 210. When the chassis 220 is located at the second position B2, the first end F1 of the supporter 236b leans against the second rail 232, and the second end F2 leans against the first rail 234, such that the supporter 236b supports the chassis 220 on the rack 210.

Figure 10:
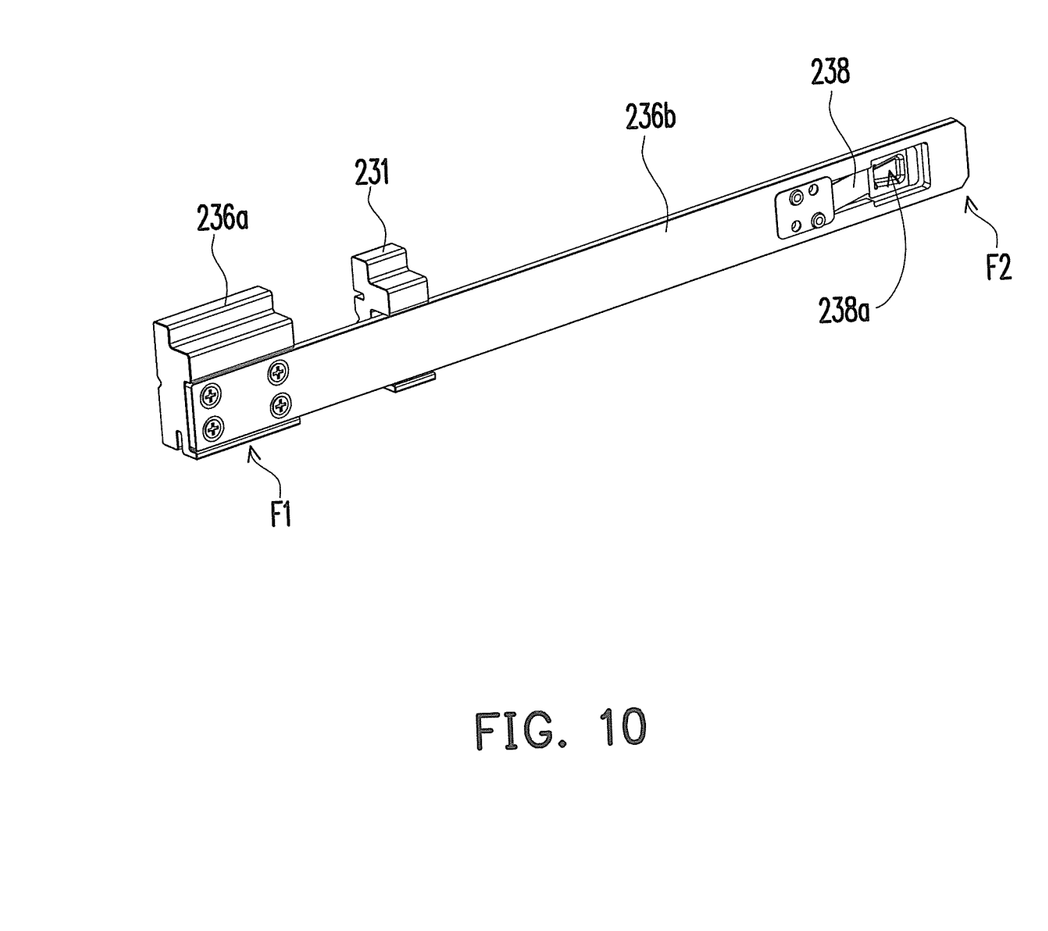
FIG. 10 is a schematic view illustrating partial components in the server depicted in FIG. 8.

FIG. 10 is a schematic view illustrating partial components in the server depicted in FIG. 8. With reference to FIGS. 8 and 10, in this embodiment, the bracket 236 further includes a slide block 236a slidably coupled to the second rail 232. The first end F1 of the supporter 236b is mounted onto the slide block 236a. Besides, the rail device 230 further includes a first latch 238 disposed between the chassis 220 and the supporter 236b. When the chassis 220 moves away from the first position B1, the first latch 238 locks the chassis 220 and the supporter 236b, such that the chassis 220 drives the slide block 236a to move along the second rail 232.

Figure 11:
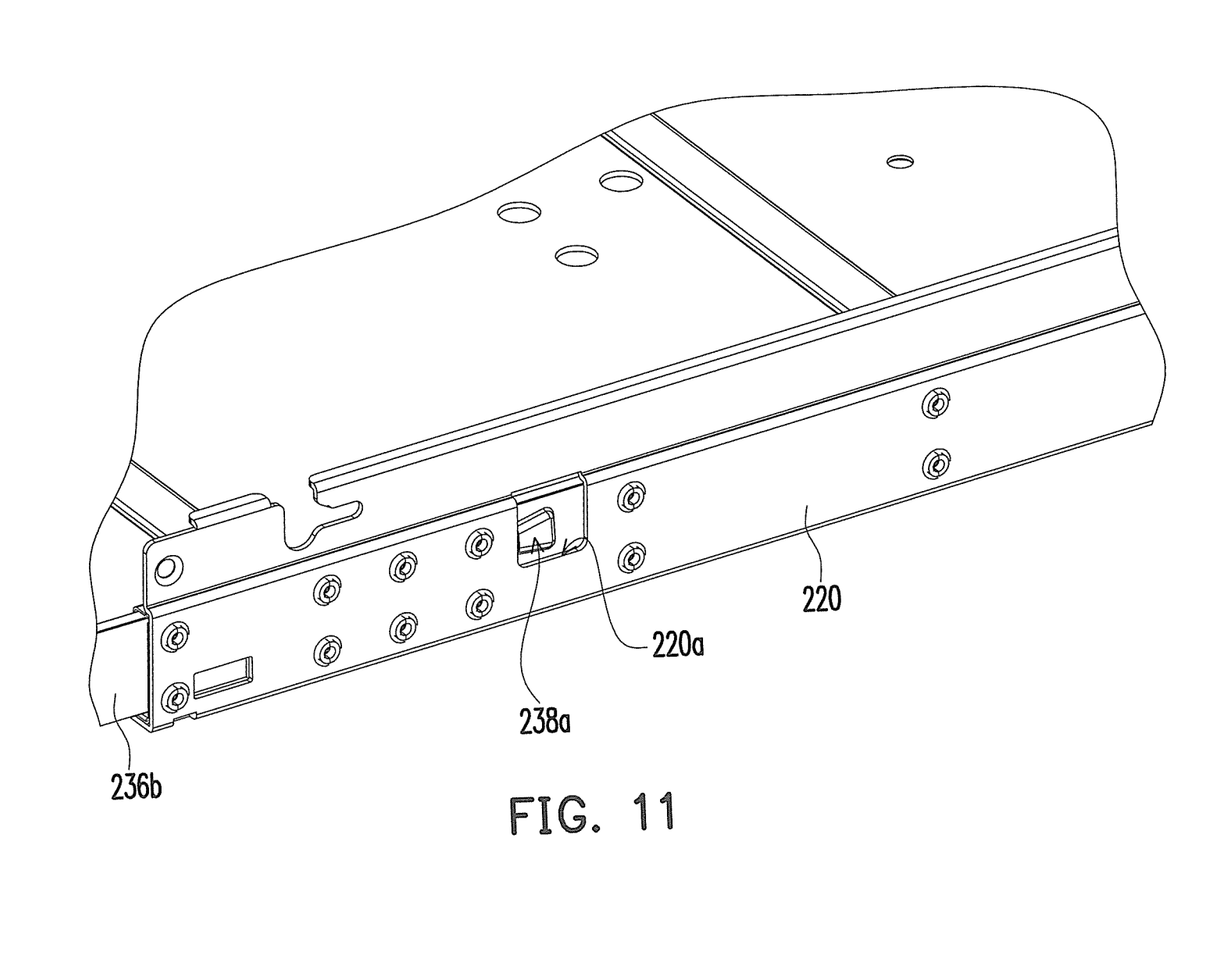
FIG. 11 is a partial enlarged view illustrating the server depicted in FIG. 8.

FIG. 11 is a partial enlarged view illustrating the server depicted in FIG. 8. To clearly illustrate the buckling relation between the chassis 220 and the first latch 238, the second rail 232 is not depicted in FIG. 11. In particular, according to this embodiment as shown in FIGS. 10 and 11, the first latch 238 is, for example, an elastic sheet of which one side is mounted onto the supporter 236b and the other side is extended to the chassis 220 from the supporter 236b and compressed by the chassis 220. Note that the first latch 238 has a buckling portion 238a, and the chassis 220 has an opening 220a. When the chassis 220 moves away from the first position B1 depicted in FIG. 8 at a distance, the opening 220a corresponds to the buckling portion 238a. Therefore, the buckling portion 238a of the first latch 238 is fastened to the opening 220a of the chassis 220 because of an elastic force, such that the chassis 220 and the supporter 236b are locked together. Further, when a user pulls out the chassis 220, the bracket 236 can also be driven to move.

On the other hand, when the chassis 220 is completely pulled out from the rack 210 (depicted in FIG. 8) and arrives at the second position B2 depicted in FIG. 9, the chassis 220 respectively leans against the first rail 234 and the second rail 232 via the supporter 236b and the slide block 236a, such that the chassis 220 stays on the rail device 230. When the chassis 220 is to be disassembled from the rail device 230, the buckling portion 238a of the first latch 238 is pressed and then removed from the opening 220a of the chassis 220. Thereby, the first latch 238 unlocks the chassis 220.

Figure 12:
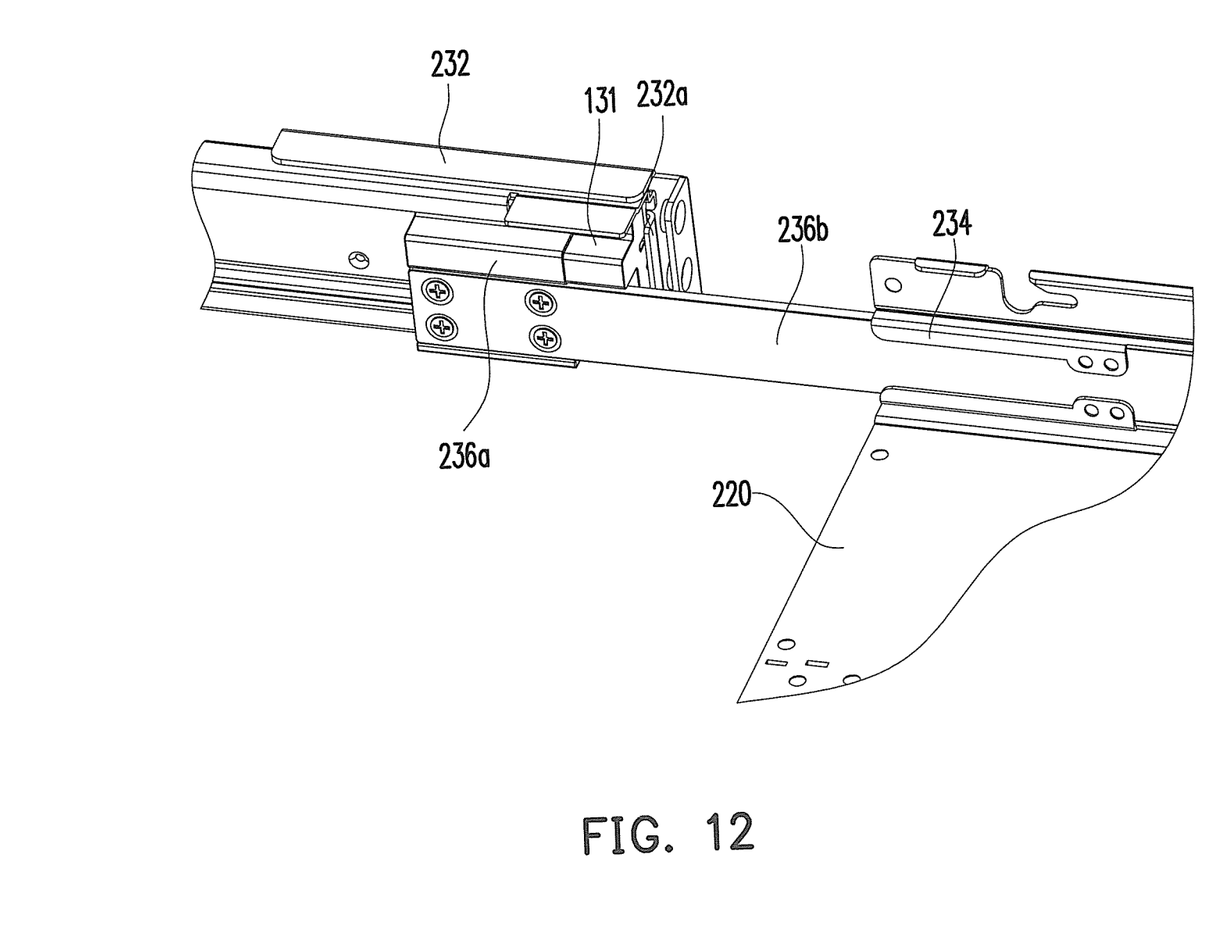
FIG. 12 is a partial enlarged view illustrating the server depicted in FIG. 9.

Further, in FIGS. 9 and 10, the rail device 230 further includes a driver 231 slidably disposed at the second rail 232 and slidably coupled to the supporter 236b. Besides, please refer to FIG. 12. FIG. 12 is a partial enlarged view illustrating the server depicted in FIG. 9. To clearly illustrate the correlation between the second rail 232 and the driver 231, the rack 210 is not depicted in FIG. 12. In FIGS. 9, 10, and 12, the second rail 232 has a first stopper 232a. When the chassis 220 moves from the first position B1 depicted in FIG. 8 to the second position B2 depicted in FIG. 9, the slide block 236a and the driver 231 are driven by the first latch 238, such that the chassis 220 can move the slide block 236a and the driver 231 along the second rail 232. When the chassis 220 moves to the second position B2, the first stopper 232a of the second rail 232 interferes with the driver 231, so as to block the slide block 236a and the driver 231 from moving. Thereby, the chassis 220 stops moving and is completely pulled out from the rack 210 as shown in FIG. 9.

Figure 13:
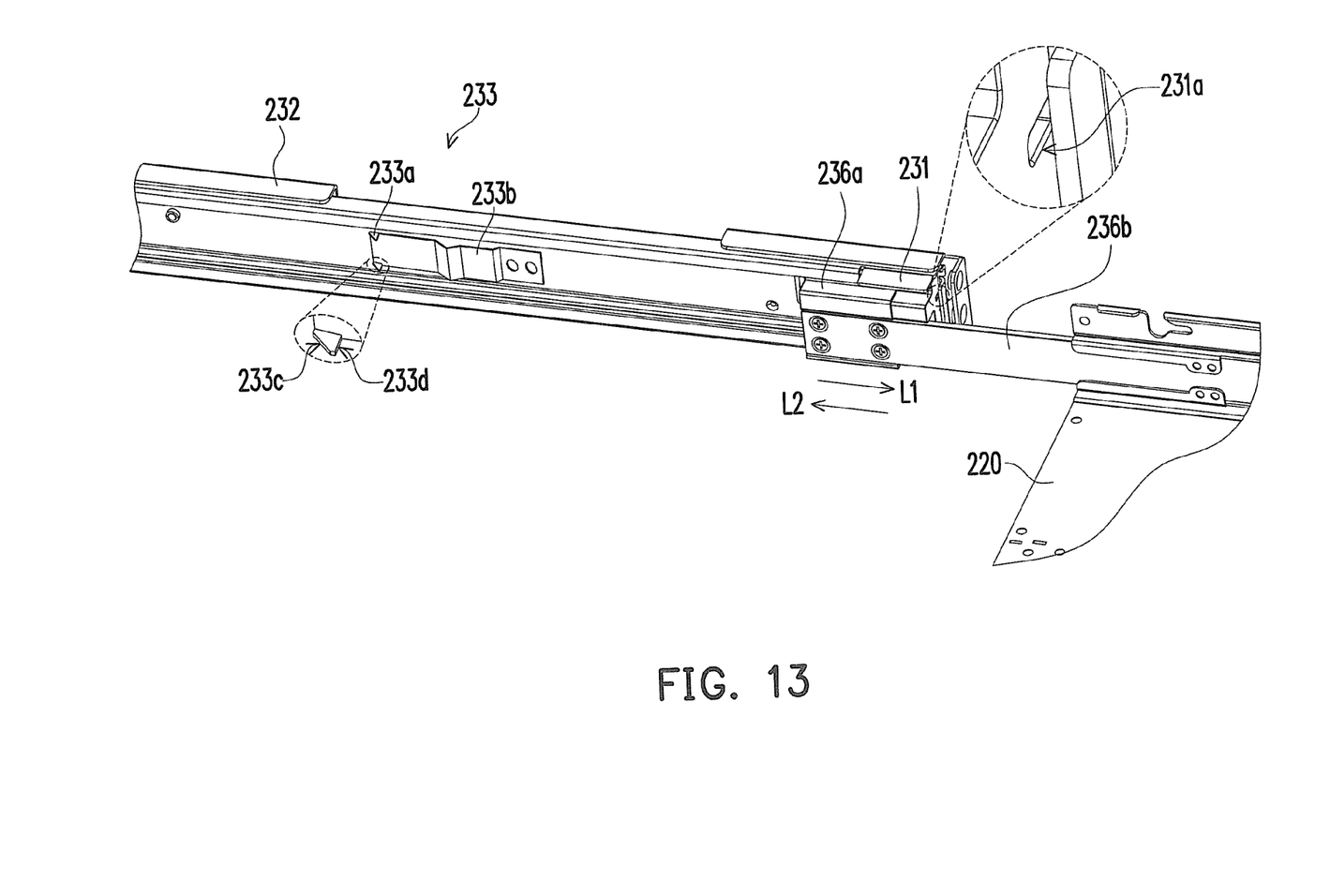
FIG. 13 is a partial enlarged view illustrating the server depicted in FIG. 9.

FIG. 13 is a partial enlarged view illustrating the server depicted in FIG. 9. With reference to FIGS. 9 and 13, the rail device 230 of this embodiment further includes a second latch 233 which is, for example, an elastic sheet. The second latch 233 is located on a moving path of the slide block 236a and the driver 231. A side of the second latch 233 is mounted onto the second rail 232, and the other side of the second latch 233 is extended toward the chassis 220. The second latch 233 has a second stopper 233a and a pressing portion 233b. Here, the second stopper 233a has a sliding side 233c and a blocking side 233d.

To be more specific, the second stopper 233a is located on the moving path of the slide block 236a, and the sliding side 233c is in the same direction as a first sliding direction L1 of the slide block 236a. Hence, when the slide block 236a is moved at the first rail 232 in the first sliding direction L1, the slide block 236a can compress the second latch 233 along the sliding side 233c and pass through the second latch 233.

On the contrary, the blocking side 233d of the second latch 233 is in a direction perpendicular to a second sliding direction L2 of the slide block 236a. Thus, when the slide block 236a moves in the second sliding direction L2, the slide block 236a is blocked by the blocking side 233d. After the chassis 220 pushes the driver 231 to move in the second sliding direction L2 and press the pressing portion 233b to compress the second latch 233, the blocking side 233d can then be moved away from the slide block 236a. As such, the slide block 236a can resume moving along the second sliding direction L2. Moreover, it should be mentioned that the driver 231 has a groove 231a corresponding to the second stopper 233a. Therefore, when the driver 231 is moved along the second sliding direction L2, the driver 231 is not blocked by the second stopper 233a.

In light of the foregoing, the rail devices are respectively installed at the inner side and the outer side of the chassis according to the above embodiments of the invention, so as to effectively increase the accommodation space of the chassis. Moreover, by the arrangement of the rail devices, the bracket, and the chassis in the invention, the chassis can move relative to the rack. Besides, via the supporter between the bracket and the rails, the chassis can remain horizontal after the chassis is pulled out from the rack. As such, the server of this invention includes expandability and mobility as its special features.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A rail device used in a server, the server comprising a rack and at least one chassis, the rail device comprising:
   a first rail installed in the chassis;
   a bracket comprising:
   a second rail mounted onto the rack and having an actuator, a first stopper and a second stopper;
   a supporter having a first end and a second end, the first end being coupled to the second rail, the second end being slidably disposed at the first rail, such that the chassis moves between a first position and a second position relative to the rack, wherein when the chassis is located at the second position, the first end of the supporter leans against the second rail, and the second end leans against the first rail to support the chassis on the rack;
   a driver coupled to the supporter; and
   a slide block mounted to the first end of the supporter and slidably coupled to the second rail; and
   a first latch disposed between the chassis and the supporter, wherein when the actuator drives the first latch to release the driver, the first stopper blocks the movement of the driver, the second stopper blocks the movement of the slide block, and the chassis moves to the second position relative to the supporter.

2. The rail device as claimed in claim 1,
   wherein the first end of the supporter is mounted to the slide block.

3. The rail device as claimed in claim 2,
   wherein when the chassis moves away from the first position, the first latch locks the chassis and the supporter, such that the chassis drives the slide block to move along the second rail.

4. The rail device as claimed in claim 3,
   wherein when the chassis moves away from the first position, the first latch locks the driver, and the driver drives the supporter and the slide block to move along the second rail.

5. The rail device as claimed in claim 4, wherein the actuator drives the first latch to release the driver when the chassis is located between the first position and the second position.

6. The rail device as claimed in claim 1, wherein when the chassis is located at the second position, the driver leans against the second rail and supports the supporter.

7. The rail device as claimed in claim 3, further comprising a second latch disposed on the chassis, the second latch locking the supporter when the chassis moves to the second position, so as to fix the chassis onto the bracket.

* * * * *